(12) United States Patent
Dixon et al.

(10) Patent No.: US 10,477,739 B2
(45) Date of Patent: Nov. 12, 2019

(54) THERMALLY-CONDUCTIVE ELECTROMAGNETIC INTERFERENCE (EMI) ABSORBERS POSITIONED OR POSITIONABLE BETWEEN BOARD LEVEL SHIELDS AND HEAT SINKS

(71) Applicant: Laird Technologies, Inc., Earth City, MO (US)

(72) Inventors: Paul Francis Dixon, Sharon, MA (US); Mohammadali Khorrami, Foxboro, MA (US)

(73) Assignee: Laird Technologies, Inc., Chesterfield ( * ) Notice: Subject to any disclaimer, the term of this patent is extended or adjusted under 35 U.S.C. 154(b) by 0 days.

(21) Appl. No.: 15/936,045

(22) Filed: Mar. 26, 2018

(65) Prior Publication Data

US 2018/0228063 A1 Aug. 9, 2018

Related U.S. Application Data

(63) Continuation of application No. PCT/US2016/052059, filed on Sep. 16, 2016.
(Continued)

(51) Int. Cl.
*H05K 9/00* (2006.01)
*H05K 1/02* (2006.01)
*H05K 1/18* (2006.01)

(52) U.S. Cl.
CPC ......... *H05K 9/0032* (2013.01); *H05K 1/0203* (2013.01); *H05K 1/181* (2013.01); *H05K 2201/10371* (2013.01)

(58) Field of Classification Search
CPC .... H05K 9/0032; H05K 1/181; H05K 9/0073; H05K 7/20445; H05K 2201/10371;
(Continued)

(56) References Cited

U.S. PATENT DOCUMENTS

| | | | |
|---|---|---|---|
| 5,541,811 | A | 7/1996 | Henningsson et al. |
| 6,514,428 | B2 | 2/2003 | Suzuki et al. |

(Continued)

FOREIGN PATENT DOCUMENTS

| | | |
|---|---|---|
| CN | 103313584 | 9/2013 |
| CN | 103929935 A | 7/2014 |

(Continued)

OTHER PUBLICATIONS

International Search Report and Written Opinion for PCT Application No. PCT/US2016/052059, filed Sep. 16, 2016 which claims priority to the same parent application as the instant application, dated Dec. 19, 2016, 14 pages.

(Continued)

*Primary Examiner* — Mandeep S Buttar
(74) *Attorney, Agent, or Firm* — Harness, Dickey & Pierce, P.L.C.; Anthony G. Fussner

(57) ABSTRACT

According to various aspects, exemplary embodiments are disclosed that include thermally-conductive EMI absorbers. In an exemplary embodiment, a thermally-conductive EMI absorber includes one or more portions disposed between a board level shield and a heat dissipation/removal structure. The thermally-conductive EMI absorber may be operable for attenuating EMI that propagates within the portions of the thermally-conductive EMI absorber between the board level shield and a heat dissipation/removal structure.

18 Claims, 4 Drawing Sheets

Related U.S. Application Data

(60) Provisional application No. 62/242,595, filed on Oct. 16, 2015.

(58) Field of Classification Search
CPC ... H01L 23/36; H01L 23/552; H01L 2924/00; H01L 2224/73265; H01L 2924/00012; H01L 2924/0002; H01L 2924/14; H01L 2924/3025; H01L 2924/16152; H01L 2924/01029; H01L 2924/01074; H01L 2924/01082; H01L 2924/1532; H01L 21/4882; H01L 2924/1421; H01L 2924/1676
USPC ....... 361/719, 818, 704, 707, 709, 800, 816; 174/377, 350, 388
See application file for complete search history.

(56) References Cited

U.S. PATENT DOCUMENTS

| | | | |
|---|---|---|---|
| 7,018,701 | B2 | 3/2006 | Yamada et al. |
| 7,317,618 | B2 | 1/2008 | Robinson et al. |
| 7,417,078 | B2 | 8/2008 | Fujiki et al. |
| 7,463,496 | B2 | 12/2008 | Robinson et al. |
| 7,608,326 | B2 | 10/2009 | Johnson |
| 7,623,360 | B2 | 11/2009 | English et al. |
| 7,842,381 | B2 | 11/2010 | Johnson |
| 9,260,645 | B2 | 2/2016 | Bruzda |
| 9,330,998 | B2 * | 5/2016 | Strader ................. H01L 23/367 |
| 10,104,763 | B2 * | 10/2018 | Lee .................... H05K 7/20454 |
| 2003/0193794 | A1 * | 10/2003 | Reis ...................... H01L 23/552 361/816 |
| 2006/0099403 | A1 * | 5/2006 | Johnson .............. H01L 23/3733 428/323 |
| 2008/0012103 | A1 | 1/2008 | Foster et al. |
| 2015/0201533 | A1 | 7/2015 | Daughtry, Jr. et al. |
| 2016/0023498 | A1 | 1/2016 | Durnen |
| 2016/0233173 | A1 | 8/2016 | Do et al. |
| 2018/0110158 | A1 * | 4/2018 | Talpallikar ............ F28F 13/003 |

FOREIGN PATENT DOCUMENTS

| | | |
|---|---|---|
| JP | H05-243412 A | 9/1993 |
| JP | H07170088 A | 7/1995 |
| JP | 2001015656 A | 1/2001 |
| JP | 3949612 B2 | 7/2007 |
| JP | 2007251639 A | 9/2007 |
| KR | 101544587 B1 | 8/2015 |
| KR | 101549986 B1 | 9/2015 |
| KR | 101607677 B1 | 4/2016 |
| WO | WO-2016077683 A1 | 5/2016 |
| WO | WO-2016126449 A1 | 8/2016 |

OTHER PUBLICATIONS

European Search Report dated Sep. 7, 2018 for European Application No. 16855916.9 which claims priority to the same parent application as the instant application, 4 pages.

Chinese Office Action dated May 10, 2018 for Chinese Application No. 201610903239.9 which claims priority to the same parent application as the instant application, 6 pages.

* cited by examiner

THERMALLY-CONDUCTIVE ELECTROMAGNETIC INTERFERENCE (EMI) ABSORBERS POSITIONED OR POSITIONABLE BETWEEN BOARD LEVEL SHIELDS AND HEAT SINKS

CROSS-REFERENCE TO RELATED APPLICATIONS

This application is a U.S. continuation application that claims priority to and the benefit of PCT International Application No. PCT/US2016/052059 filed Sep. 15, 2016 (published as WO 2017/065922 filed Apr. 20, 2017) which, in turn, claims priority to and the benefit of U.S. Provisional Patent Application No. 62/242,595 filed Oct. 16, 2015. The entire disclosures of the above applications are incorporated herein by reference.

FIELD

The present disclosure generally relates to thermally-conductive EMI absorbers, which may be positionable or positioned between a board level shield (BLS) and a heat sink or chassis (broadly, a heat dissipation/removal structure).

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

Figure 1:
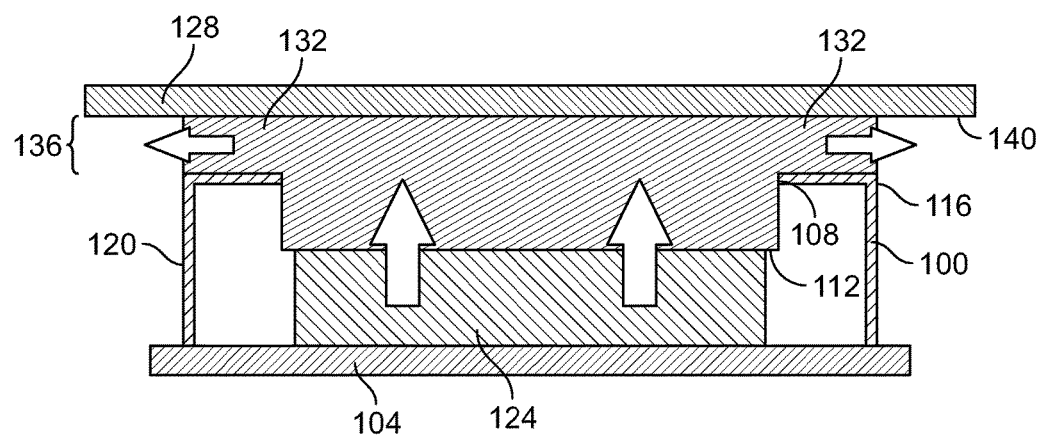
FIG. 1 shows an exemplary embodiment in which portions of a thermally-conductive EMI absorber are positioned between a board level shield (BLS) and a heat sink or chassis (broadly, a heat removal/dissipation structure or component)
Figure 4:
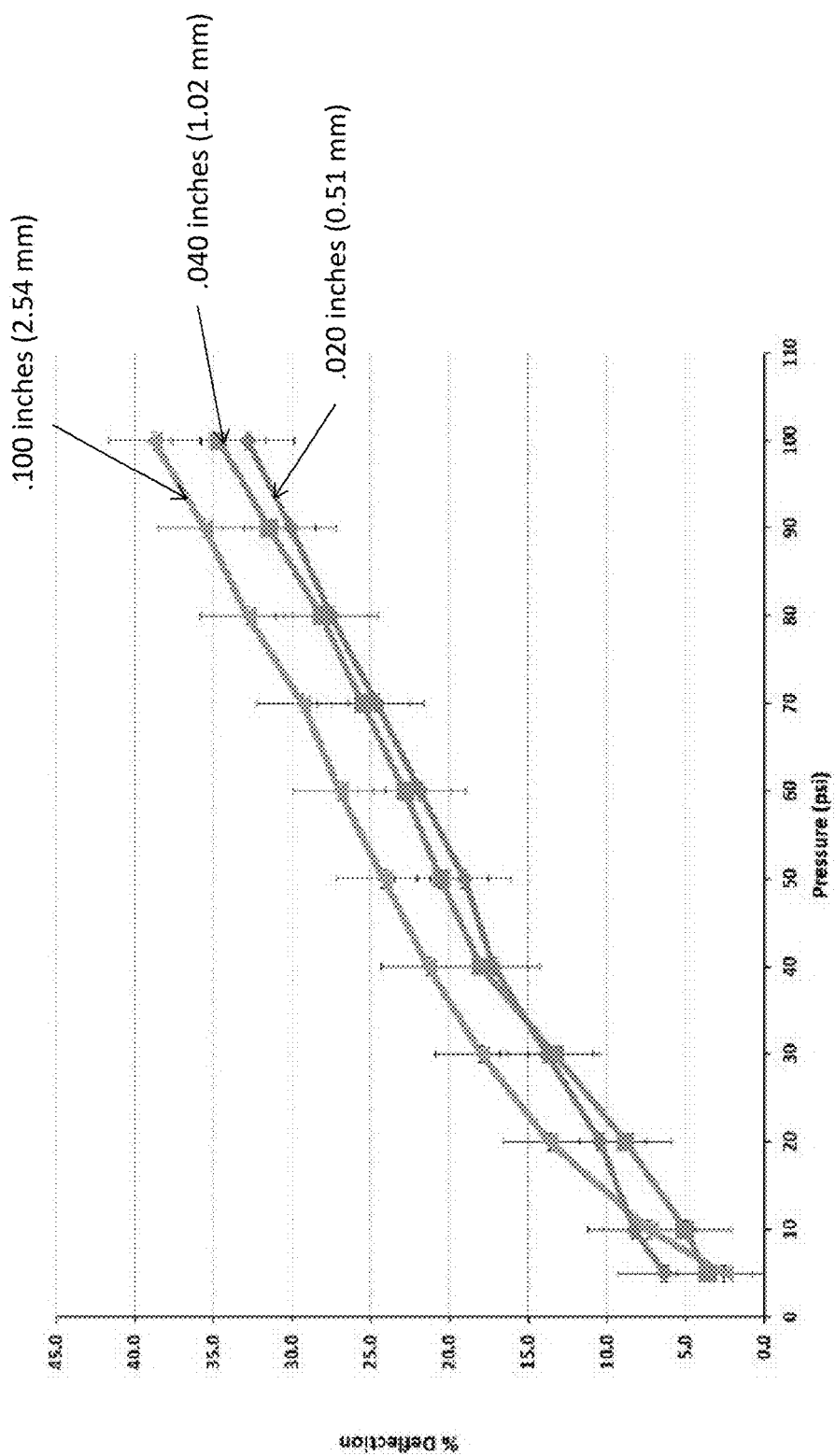
Figure 5:
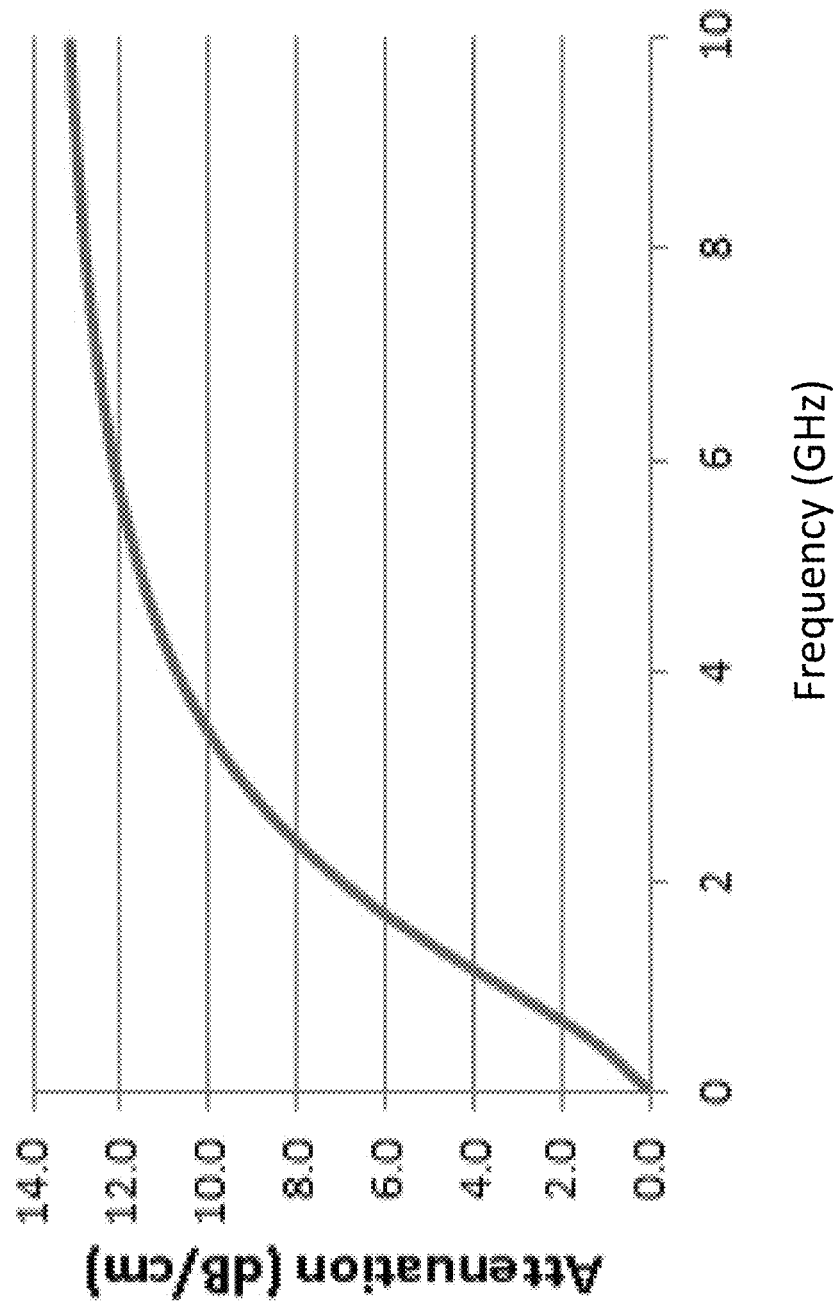

FIG. 4 is an exemplary line graph of percent deflection (ASTM D575) versus pressure (psi) for example hybrid thermal/EMI absorbers having thicknesses of 0.1 inches (2.54 mm), 0.040 inches (1.02 mm), and 020 inches (0.51 mm) that may be used in the exemplary embodiments shown in FIGS. 1 and/or 2; and FIG. 5 is an exemplary line graph of attenuation in decibels per centimeter (dB/cm) versus frequency in Gigahertz (GHz) for an example hybrid thermal/EMI absorber that may be used in the exemplary embodiments shown in FIGS. 1 and/or 2.

Corresponding reference numbers indicate corresponding parts throughout the several views of the drawings.

DETAILED DESCRIPTION

Example embodiments will now be described more fully with reference to the accompanying drawings.

Board level shields effectively prevent radiated electromagnetic emissions. But board level shields are not efficient thermal interface materials, hence thermal issues can be an issue. To alleviate the thermal issues, holes or openings may be made in a BLS to allow heat to escape. Thermal interface materials (TIMs) may also be used to conduct heat outside the BLS. But as recognized by the inventors hereof, the holes and the TIMs create an efficient conduit for electromagnetic interference (EMI) to escape from under the BLS.

The insertion of the TIM in the BLS opening increases the radiated electromagnetic emissions due to the TIM acting as a conduit or waveguide, which guides or channels energy through the BLS opening to the outside.

After recognizing the above, the inventors hereof developed and disclose herein exemplary embodiments in which a thermally-conductive EMI absorber may be positioned relative to (e.g., within, over, adjacent, etc.) an opening(s) in a BLS to attenuate EMI passing through the opening in the BLS before the EMI can radiate or emerge, e.g., before the EMI can interfere with the operation of adjacent electronic devices, etc. The thermally-conductive EMI absorber may include at least a portion that is placed generally between (e.g., in direct contact with, etc.) the BLS and a heat sink or chassis (broadly, a heat removal/dissipation structure or component).

For example, the thermally-conductive EMI absorber may be placed within an opening in a BLS so that the thermally-conductive EMI absorber is in direct contact with a chip (broadly, a heat source or component) on a PCB and a heat sink, chassis, or other heat removal/dissipation structure or component. The thermally-conductive EMI absorber may also include portions that are outside a perimeter of the opening, that are disposed within the space or gap separating or defined between the top of the BLS and the heat sink or chassis, and/or that are in contact (e.g., in direct contact without any intervening components or gaps therebetween, etc.) with the top of the BLS and the heat sink or chassis. In this example, the thermally-conductive EMI absorber may be operable to channel thermal energy or conduct heat from the chip through the opening in the BLS to the heat sink or chassis. Accordingly, the thermally-conductive EMI absorber thus defines a thermally-conductive heat path from the chip to the heat sink or chassis. In addition, the thermally-conductive EMI absorber may also be operable to channel (unwanted) EMI energy out of the BLS. When the EMI energy hits or is blocked by the heat sink/chassis, the EMI energy may then be redirected to propagate within, through, or along the thermally-conductive EMI absorber between the BLS and heat sink/chassis. As the EMI energy travels or propagates within the thermally-conductive EMI absorber between the BLS and heat sink/chassis, the thermally-conductive EMI absorber attenuates the EMI energy before the EMI energy can emerge or radiate externally out of the thermally-conductive EMI absorber.

As another example, a thermally-conductive EMI absorber may be placed between a thermal interface material and a heat sink or chassis. The thermally-conductive EMI absorber may also be placed over an opening in a BLS. A thermal interface material may be positioned within the opening in the BLS so that the thermal interface material is in direct thermal contact with the thermally-conductive EMI absorber and a chip and the BLS and the heat sink or chassis. The thermally-conductive EMI absorber may also include portions that are outside a perimeter of the opening, that are disposed within the space separating or defined between the top of the BLS and the heat sink or chassis, and/or that are in contact (e.g., in direct contact without any intervening components or gaps therebetween, etc.) with the top of the BLS and the heat sink or chassis. In this example, the thermal interface material may be operable to channel thermal energy or conduct heat from the chip through the opening in the BLS to the thermally-conductive EMI absorber, which, in turn, may be operable to channel thermal energy or conduct heat from the thermal interface material to the heat sink or chassis. Accordingly, the thermal interface material and thermally-conductive EMI absorber thus cooperate to define a thermally-conductive heat path from the chip to the heat sink or chassis. In addition, the thermally-conductive EMI absorber may also be operable to channel (unwanted) EMI energy out of the BLS. When the EMI energy hits or is blocked by the heat sink/chassis, the EMI energy may then be redirected to propagate within, through, or along the thermally-conductive EMI absorber between the BLS and heat sink/chassis. As the EMI energy travels or propagates through or along the thermally-conductive EMI absorber between the BLS and heat sink/chassis, the thermally-conductive EMI absorber attenuates the EMI energy before the EMI energy can emerge or radiate externally out of the thermally-conductive EMI absorber.

In exemplary embodiments in which a bottom portion of a thermal interface material will be in contact with or adjacent a heat source, at least the bottom portion of the thermal interface material may be dielectric and not electrically-conductive. In which case, the thermal interface material will not short out the heat source or otherwise adversely affect performance of the PCB when the thermal interface material is positioned in contact with or adjacent the heat source.

In other exemplary embodiments in which a bottom portion of a thermally-conductive EMI absorber will be in contact with or adjacent a heat source, at least the bottom portion of the thermally-conductive EMI absorber may be dielectric and not electrically-conductive. In which case, the thermally-conductive EMI absorber will not short out the heat source or otherwise adversely affect performance of the PCB when the thermally-conductive EMI absorber is positioned in contact with or adjacent the heat source.

With reference now to the figures, FIG. 1 illustrates a thermally-conductive EMI absorber 112 including a portion within an opening 108 in a top or upper surface 116 of a BLS 100. The BLS 100 also includes sidewalls 120 depending from the BLS upper surface 116. The sidewalls 120 are configured for installation (e.g., soldering, etc.) to a printed circuit board (PCB) 104 (broadly, a substrate) generally about one or more components (e.g., chip 124, other heat source, etc.) on the PCB 104. Alternatively, the thermally-conductive EMI absorber 112 may be used with (e.g., as a lid or cover for, etc.) a BLS fence or frame that defines the opening.

In this exemplary embodiment, the thermally-conductive EMI absorber 112 extends through the BLS opening 108 such that portions of the thermally-conductive thermal absorber 112 make direct contact respectively with the chip 124 (broadly, a heat source) and a heat sink or chassis 128 (broadly, a heat removal/dissipation structure or component). Alternative embodiments may include one or more intervening components or layers (e.g., an EMI shielding component, a TIM, a dielectric material, etc.) between the thermally-conductive EMI absorber 112 and the chip 124 and/or between the thermally-conductive EMI absorber 112 and the heat sink or chassis 128.

The thermally-conductive EMI absorber 112 includes portions 132 disposed outside the perimeter of the opening 108. The portions 132 are disposed within the gap or space 136 separating or defined between the BLS upper surface 116 and a bottom or lower surface 140 of the heat sink or chassis 128. The portions 132 are preferably in direct contact with the BLS upper surface 116 and the lower surface 140 of the heat sink or chassis 128 without any gaps therebetween that might otherwise allow EMI to leak or escape without first passing through the thermally-conductive EMI absorber 112.

The thermally-conductive EMI absorber 112 is operable to channel thermal energy or conduct heat from the chip 124 through the opening 108 in the BLS 100 to the heat sink or chassis 128. The thermally-conductive EMI absorber 112 may thus define a thermally-conductive heat path, thermal joint, interface, or pathway from the chip 124 to the heat sink or chassis 128 along which heat may be transferred (e.g., conducted) from the chip 124 to the heat sink or chassis 128.

In addition, the thermally-conductive EMI absorber 112 is operable to channel (unwanted) EMI energy (represented by arrows in FIG. 1) out of the BLS 100. When the EMI energy hits or is blocked by the heat sink/chassis 128, the EMI energy then travels or propagates within, along, or through the portions 132 of the thermally-conductive EMI absorber 112 between the BLS upper surface 116 and the lower surface 140 of the heat sink/chassis 128. As the EMI energy travels or propagates within the thermally-conductive EMI absorber 112 between the BLS upper surface 116 and the lower surface 140 of the heat sink/chassis 128, the thermally-conductive EMI absorber 112 attenuates the EMI energy before the EMI energy can emerge or radiate externally out of the thermally-conductive EMI absorber 112.

As represented by the arrows pointing up in FIG. 1, the thermally-conductive EMI absorber 112 may attenuate EMI energy as it travels through the thermally-conductive EMI absorber 112 generally parallel to the direction of heat flow (up in FIG. 1) from the chip 124 to the heat sink/chassis 128 As represented by the arrows pointing left and right in FIG. 1, the thermally-conductive EMI absorber 112 may also attenuate EMI energy as it travels through the thermally-conductive EMI absorber 112 generally perpendicular (right and left in FIG. 1) to the direction of heat flow from the chip 124 to the heat sink or chassis 128. Accordingly, the BLS 100, the thermally-conductive EMI absorber 112, and the heat sink or chassis 128 may thus be operable for providing electromagnetic interference (EMI) shielding for the chip 124.

The sizes of the thermally-conductive EMI absorber 112, the BLS 100, and the opening 108 in the BLS 100 may vary depending on the particular application. For example, the size of the opening 108 in the BLS 100 may depend on thermal performance requirements. The size of the thermally-conductive EMI absorber 112 may depend on EMI shielding performance requirements. The thermally-conductive EMI absorber 112 may be at least as large as the opening 108 or larger to obtain better EMI performance, e.g., as large as the entire BLS upper surface 116 or portion thereof, etc.

Although FIG. 1 shows the thermally-conductive EMI absorber 112 positioned between the chip 124 and the heat sink or chassis 128, example embodiments of the thermally-conductive EMI absorbers and board level shields disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material and/or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Figure 2:
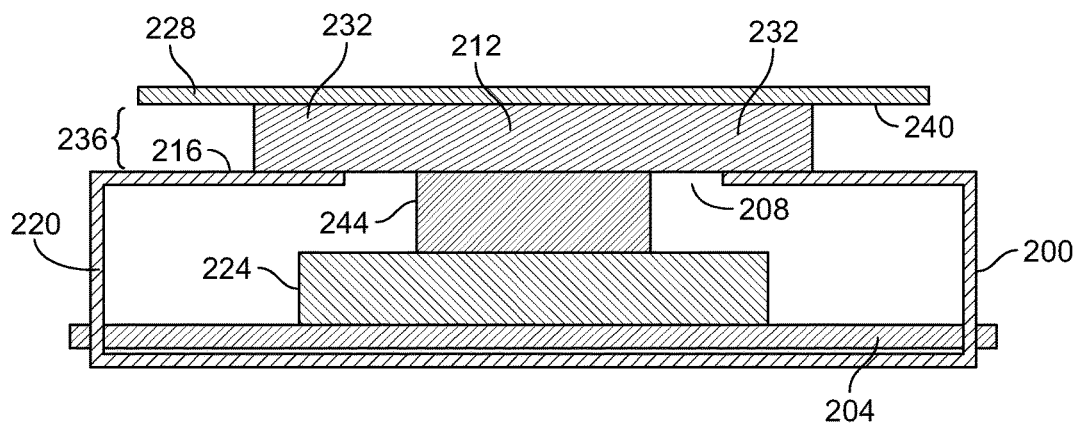
FIG. 2 shows another exemplary embodiment in which portions of a thermally-conductive EMI absorber are positioned between a BLS and a heat sink or chassis.

In another exemplary embodiment shown in FIG. 2, a thermal interface material 244 is positioned within an opening 208 in a top or upper surface 216 of a BLS 200. A thermally-conductive EMI absorber 212 is positioned between the thermal interface material 244 and a heat sink or chassis 228 (broadly, a heat removal/dissipation structure or component). The BLS 200 also includes sidewalls 220 configured for installation to the PCB 204 generally about one or more components (e.g., chip 224, etc.) on the PCB 204. Alternatively, the thermally-conductive EMI absorber 212 may be used with (e.g., as a lid or cover for, etc.) a BLS fence or frame that defines the opening.

The thermal interface material 244 may also be referred to as a first thermal interface material or TIM1. The thermally-conductive EMI absorber 212 may also be referred to as a second thermal interface material or TIM2. The thermally-conductive EMI absorber 212 may also be referred to as a hybrid TIM/absorber as it may have the properties of or function as both a thermal interface material and an EMI absorber. In addition, the thermal interface material 244 may also comprise a thermally-conductive EMI absorber, which may be same as or different than the other thermally-conductive EMI absorber 212. Alternatively, the thermal interface material 244 may comprise as thermal gap filler, thermal phase change material, thermal grease, thermal paste, thermal putty, dispensable thermal interface material, thermal pad, etc.

In this exemplary embodiment, the thermal interface material 244 is in direct contact with the chip 224 (broadly, a heat source) on the PCB 204. The thermally-conductive EMI absorber 212 is between and in direct contact with the thermal interface material 244 and a heat sink or chassis 228 (broadly, a heat removal/dissipation structure or component). Alternative embodiments may include one or more intervening components or layers (e.g., an EMI shielding component, a TIM, a dielectric material, etc.) between the thermal interface material 244 and the chip 224, between the thermally-conductive EMI absorber 212 and the thermal interface material 244, and/or between the thermally-conductive EMI absorber 212 and the heat sink or chassis 228.

The thermally-conductive EMI absorber 212 includes portions 232 disposed outside the perimeter of the opening 208. The portions 232 are disposed within the gap or space 236 separating or defined between the BLS upper surface 216 and a bottom or lower surface 240 of the heat sink or chassis 228. The portions 232 are preferably in direct contact with the BLS upper surface 216 and the lower surface 240 of the heat sink or chassis 228 without any gaps therebetween that might otherwise allow EMI to leak or escape without first passing through the thermally-conductive EMI absorber 212.

In this example, the thermal interface material 244 is operable to channel thermal energy or conduct heat from the chip 224 through the opening 208 in BLS 200 to the thermally-conductive EMI absorber 212. The thermally-conductive EMI absorber 212 is operable to channel thermal energy or conduct heat from the thermal interface material 244 to the heat sink or chassis 228. Accordingly, the thermal interface material 244 and thermally-conductive EMI absorber 212 may thus cooperate to define a thermally-conductive heat path, thermal joint, interface, or pathway from the chip 224 to the heat sink or chassis 228 along which heat may be transferred (e.g., conducted) from the chip 224 to the heat sink or chassis 228.

In addition, the thermally-conductive EMI absorber 212 is also operable to channel (unwanted) EMI energy out of the BLS 200. When the EMI energy hits or is blocked by the heat sink/chassis 228, the EMI energy then travels or propagates within, through, or along the portions 232 of the thermally-conductive EMI absorber 212 between the BLS upper surface 216 and the heat sink/chassis 228. As the EMI energy travels or propagates within the thermally-conductive EMI absorber 212 between the BLS upper surface 216 and the lower surface 240 of the heat sink/chassis 228, the thermally-conductive EMI absorber 212 attenuates the EMI energy before the EMI energy can emerge or radiate externally out of the thermally-conductive EMI absorber 212.

In this exemplary embodiment, the thermally-conductive EMI absorber 212 may attenuate EMI energy as it travels through the thermally-conductive EMI absorber 212 generally perpendicular (right and left in FIG. 2) to the direction of heat flow (up in FIG. 2) from the chip 224 to the heat sink or chassis 228. The BLS 200, the thermally-conductive EMI absorber 212, and the heat sink or chassis 228 may thus be operable for providing EMI shielding to the chip 224.

The sizes of the thermally-conductive EMI absorber 212, the thermal interface material 244, the BLS 200, and the opening 208 in the BLS 200 may vary depending on the particular application. For example, the size of the opening 208 in the BLS 200 may depend on thermal performance requirements. The size of the thermally-conductive EMI absorber 212 may depend on EMI shielding performance requirements. The thermally-conductive EMI absorber 212 may be at least as large as the opening 208. For better EMI performance, the thermally-conductive EMI absorber 212 may be larger than the opening 208, e.g., as large as the entire BLS upper surface 216 or portion thereof, etc. The thermal interface material 244 may be smaller than the opening 208, e.g., to correspond with or match the size or footprint of the chip 224, etc.

By way of example only, the following dimensions are provided for purpose of illustration as other exemplary embodiments may be configured differently, e.g., larger, smaller, have different performance, etc. In this example, the following dimensions were used for the components shown in FIG. 2. The BLS 200 had dimensions of 19 millimeters (mm)×24 mm×0.7 mm. The opening 208 had dimensions of 6.5 mm×8.5 mm. The first thermal interface material (TIM1) 244 had dimensions of 2.5 mm×4.5 mm×0.35 mm. The distance 236 between the BLS upper surface 216 and the lower surface 240 of the heat sink/chassis 228 was 0.4 mm. The thickness of the thermally-conductive EMI absorber 212 was 0.4 mm.

Figure 3:
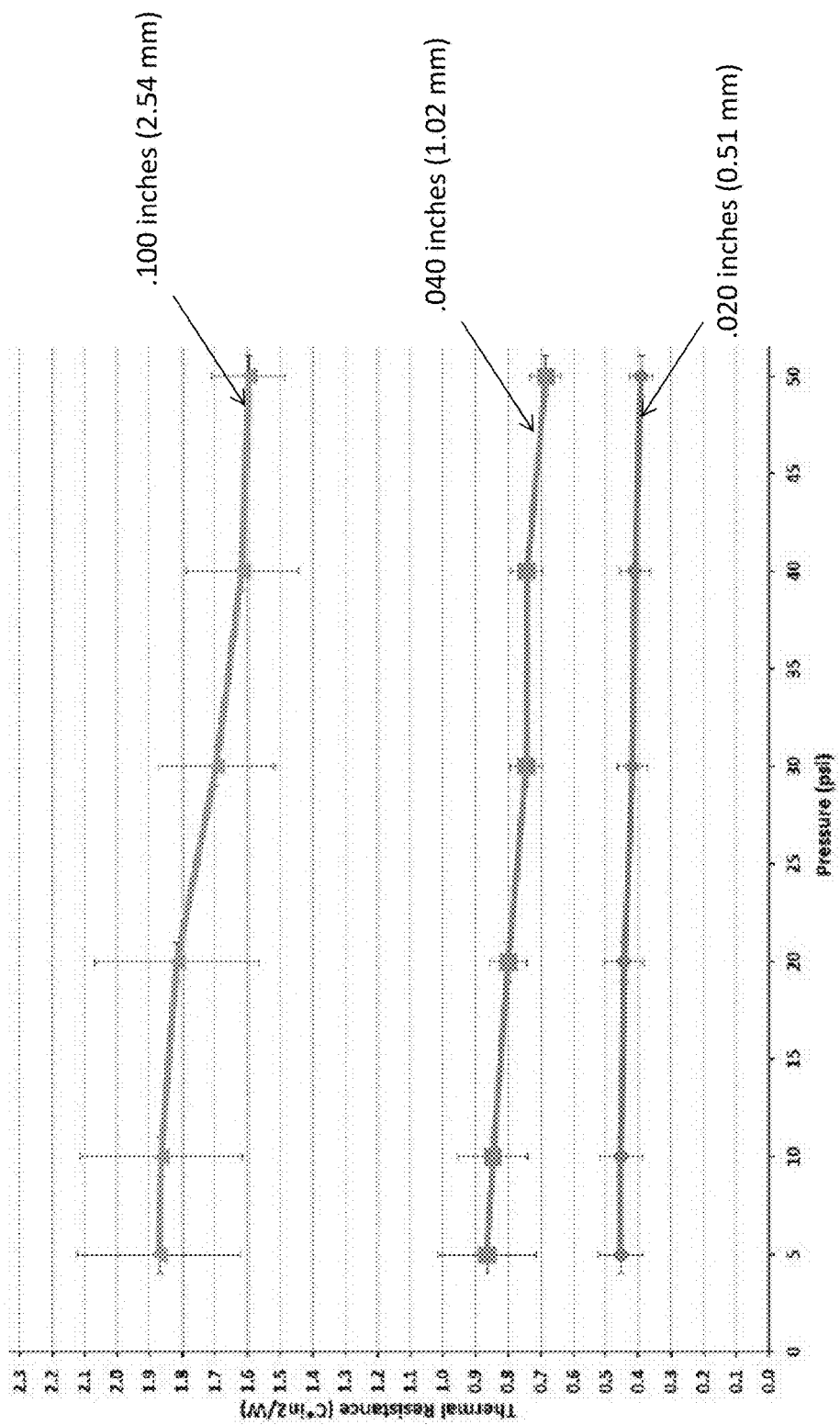
FIG. 3 is an exemplary line graph of thermal resistance in degrees Celsius inch squared per Watt (° C.*in$^2$/W) at 100° C. (ASTM D5470) versus pressure in pounds per square inch (psi) for example hybrid thermal/EMI absorbers having thicknesses of 0.1 inches (2.54 mm), 0.040 inches (1.02 mm), and 020 inches (0.51 mm) that may be used in the exemplary embodiments shown in FIGS. 1 and/or 2.

Continuing with this example, the first thermal interface material (TIM1) 244 and the thermally-conductive EMI absorber (TIM2) 212 comprised CoolZorb™ 400 series hybrid thermal/EMI absorber having the properties shown in the table below and/or in the line graphs shown in FIGS. 3, 4, and 5. The CoolZorb™ 400 series hybrid thermal/EMI absorber may be used for EMI mitigation. The CoolZorb™ 400 series hybrid thermal/EMI absorber may be used like a traditional thermal interface material between a heat source such as an integrated circuit (IC) and a heat sink, metal chassis, or other heat transfer device. The CoolZorb™ 400 series hybrid thermal/EMI absorber may also function to suppress unwanted energy coupling, resonances or surface currents causing board level EMI issues. The CoolZorb™ 400 series hybrid thermal/EMI absorber may include a silicone gel binder that imparts inherent tack typical of standard thermal gap fillers and a filler particle composition that imparts both good thermal conductivity and EMI suppression in the microwave frequency range, e.g., with best attenuation performance at or above 5 GHz, etc. The CoolZorb™ 400 series hybrid thermal/EMI absorber may be configured to pass UL94V0 requirements and regulatory requirements including RoHS and REACH. The CoolZorb™ 400 series hybrid thermal/EMI absorber may be configured so as to not require any peel and stick adhesive when used like a traditional thermal interface material due to its tacky, compliant properties.

| TYPICAL PROPERTIES | DATA | TEST METHOD |
| --- | --- | --- |
| Color | Dark Gray | Visual |
| Thermal Conductivity | 2.0 W/m-K | ASTM D5470 |
| Density | 4.5 g/cc | ASTM D792 |
| Hardness | 56 Shore 00 | ASTM D2240 |
| Tensile Strength | 60 psi | ASTM D638 |
| Temperature Range | −20° C. to 100° C. | NA |
| UL Flammability | UL94V0 | UL |
| Volume Resistivity | $5.9 \times 10^{10}$ Ω | ASTM D257 |
| Outgassing (TML) | 0.15% | ASTM E595-07 |
| Outgassing (CVCM) | 0.06% | ASTM E595-07 |
| Coefficient of Thermal Expansion (CTE) | 186 μm/mC | IPC-TM-650 2.4.41 |
| Standard Thickness Range | .020" 0.130" (0.5-3.3 mm) | |
| Thickness Tolerance | +/−.005" (+/− .127 mm) | |

By way of example the table below provides reduction in total radiated power at 2.7 Gigahertz (GHz) for a microstrip loop source (2 mm diameter) for different dimensions of the thermally-conductive EMI absorber (TIM2) 212.

| TIM2 dimension (mm) | EMI reduction |
| --- | --- |
| 6.5 × 8.5 (same as opening) | −3.8 |
| 7 × 9 | −6.3 |
| 8 × 10 | −10 |
| 10 × 10 | −13.9 |
| 11 × 11 | −16.2 |
| 12 × 12 | −18.2 |
| 13 × 13 | −20.2 |
| 14 × 14 | −22.2 |
| 19 × 24 (same as full BLS) | −28.6 |

Although FIG. 2 shows the thermal interface material 244 and thermally-conductive EMI absorber 212 positioned between the chip 224 and the heat sink or chassis 228, example embodiments of the thermal interface materials, thermally-conductive EMI absorbers, and board level shields disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Example methods are also disclosed herein. For example, a method may generally include positioning a thermally-conductive EMI absorber over and/or within an opening in an upper surface of a shield. Additionally, or alternatively, the method may include positioning the shield having the opening and the thermally-conductive EMI absorber over a heat source on a substrate, such that the thermally-conductive EMI absorber is operable for attenuating EMI that passes through the opening and propagates within the thermally-conductive EMI absorber.

The method may also include positioning a structure relative to the shield and the thermally-conductive EMI absorber such that at least a portion of the thermally-conductive EMI absorber is between the upper surface of the shield and a lower surface of the structure and such that EMI passing through the opening is blocked and redirected by the structure to propagate within and be attenuated by the at least a portion thermally-conductive EMI absorber between the upper surface of the shield and the lower surface of the structure. The thermally-conductive EMI absorber may define at least part of a thermally-conductive heat path from the heat source to the structure. The thermally-conductive EMI absorber may be configured to attenuate the EMI that passes through the opening and propagates within the thermally-conductive EMI absorber before the EMI can emerge from the thermally-conductive EMI absorber. The board level shield and the thermally-conductive EMI absorber may be operable for providing EMI shielding for the heat source.

The method may further include positioning at least a portion of the thermally-conductive EMI absorber within the opening of the board level shield; and/or positioning the thermally-conductive EMI absorber in direct contact with the upper surface of the shield and the lower surface of the structure. The method may additionally include positioning a thermal interface material within the opening in the upper surface of the shield, such that at least a portion of the thermally-conductive EMI absorber is between the thermal interface material and the structure.

A wide range of thermally-conductive EMI absorbers may be used in exemplary embodiments for the thermally-conductive EMI absorbers (e.g., 112 in FIG. 1, 212 in FIG. 2, etc.). Example thermally-conductive EMI absorbers include thermally-conductive EMI absorbers of Laird, such as CoolZorb™ series thermally-conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.). The thermally-conductive EMI absorber may comprise a hybrid thermal/EMI absorber as disclosed herein. For example, the thermally-conductive EMI absorber 112 shown in FIG. 1 may comprise a CoolZorb™ 400 series hybrid thermal/EMI absorber as described above and having the properties shown in the table above and/or in the line graphs shown in FIGS. 3, 4, and 5. Likewise, the first thermal interface material (TIM1) 244 and the thermally-conductive EMI absorber (TIM2) 212 may also comprise CoolZorb™ 400 series hybrid thermal/EMI absorber as described above and having the properties shown in the table above and/or in the line graphs shown in FIGS. 3, 4, and 5.

Also by way of example, the thermally-conductive EMI absorber may include silicon carbide (SiC) that works synergistically with the thermally-conductive materials (e.g., Alumina ($Al_2O_3$), ceramics, etc.) and EMI absorbing materials (e.g., carbonyl iron powder (CIP), etc.) to enhance both thermal conductivity and EMI absorption. The thermally-conductive EMI absorber may have high thermal conductivity (e.g., greater than 2 Watts per meter per Kelvin (W/m-K), etc.) and high EMI absorption or attenuation (e.g., at least 9 decibels per centimeter (dB/cm) at a frequency of at least 5 GHz, at least 17 dB/cm at a frequency of at least 15 GHz, etc.). In some exemplary embodiments, the thermally-conductive EMI absorber may include silicon carbide (e.g., 21 to 27 volume percent (vol %), 26 vol %, 22 vol %, 27 vol %, etc.), carbonyl iron (e.g., 8 to 38 vol %, 37 vol %, 9 vol %, 10 vol %, etc.), and alumina (e.g., 6 to 44 vol %, 7 vol %, 43 vol %, 34 vol %, etc.). The thermally-conductive EMI absorber may include a polymer matrix (e.g., silicone matrix, etc.) loaded with thermally-conductive particles (e.g., at least about 6 volume percent of the thermally-conductive particles, etc.), EMI absorbing particles (e.g., at least about 8 volume percent of the EMI absorbing particles, etc.) and silicon carbide (e.g., at least about 21 volume percent of the silicon carbide, etc.). The thermally-conductive particles may comprise one or more of alumina, zinc oxide, boron nitride, silicon nitride, aluminum, aluminum nitride, iron, metallic oxides, graphite, and a ceramic. The EMI absorbing particles may comprise one or more of carbonyl iron, iron silicide, iron oxide, iron alloy, iron-chrome compound, magnetic metal powder, permalloy, ferrite, magnetic alloy, magnetic powder, magnetic flakes, magnetic particles, nickel-based alloy, nickel-based powder, and chrome alloy.

A wide range of thermal interface materials may be used in exemplary embodiments for the first thermal interface material (e.g., 244 in FIG. 2, etc.), such as thermal gap fillers, thermal phase change materials, thermally-conductive EMI absorbers or hybrid thermal/EMI absorbers, thermal greases, thermal pastes, thermal putties, dispensable thermal interface materials, thermal pads, etc. Example embodiments may include one or more thermal interface materials of Laird, such as any one or more of the Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc.

By way of further example, the first thermal interface material may comprise an elastomer and/or ceramic particles, metal particles, ferrite EMI/RFI absorbing particles, metal or fiberglass meshes in a base of rubber, gel, or wax, etc. The first thermal interface material may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The first thermal interface material may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the first thermal interface material to closely conform (e.g., in a relatively close fitting and encapsulating manner, etc.) to a mating surface when placed in contact with (e.g., compressed against, etc.) the mating surface, including a non-flat, curved, or uneven mating surface.

The first thermal interface material may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the first thermal interface material may include ceramic filled silicone elastomer, boron nitride filled silicone elastomer, fiberglass reinforced gap filler, or a thermal phase change material that includes a generally non-reinforced film. The first thermal interface material may have a relatively low Young's modulus and Hardness Shore value (e.g., Shore 00 hardness of 25, 40, 70, 75, less than 100, less than 25, greater than 75, between 25 and 75 Shore 00, etc.).

Exemplary embodiments may include a TIM having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the TIM and loading percentage of the thermally conductive filler, if any. These thermal conductivities are only examples as other embodiments may include a TIM with a thermal conductivity higher than 6 W/mK, less than 1 W/mK, or other values between 1 and 6 W/mk. Accordingly, aspects of the present disclosure should not be limited to use with any particular TIM as exemplary embodiments may include a wide range of thermal interface materials.

In some exemplary embodiments, the thermally-conductive EMI absorber and/or thermal interface material may further include an adhesive layer, such as a pressure-sensitive adhesive (PSA), etc. The pressure-sensitive adhesive (PSA) may be generally based on compounds including acrylic, silicone, rubber, and combinations thereof. The adhesive layer may be used to affix the thermally-conductive EMI absorber and/or thermal interface material to a portion of a BLS, such as to a single piece BLS, to a cover of a multi-piece BLS, etc. Alternative affixing methods can also be used such as, for example, mechanical fasteners. In other exemplary embodiments, the thermally-conductive EMI absorber and/or thermal interface material may be sufficiently tacky or self-adherent to be self-adhered to another surface without any adhesive layer.

A wide range of materials may be used in exemplary embodiments for the heat sink or chassis (e.g., 128 in FIG. 1, 228 in FIG. 2, etc.). By way of example, the heat sink or chassis may comprise a thermally-conductive material, such as aluminum alloys, copper, graphite, other suitable metals and non-metals, etc.

A wide range of materials may be used in exemplary embodiments for the BLS (e.g., 100 in FIG. 1, 200 in FIG. 2, etc.). By way of example, a non-exhaustive list of exemplary materials from which the BLS may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein are for purposes of illustration only, as different materials may be used depending, for example, on the particular application, such as the components to be shielded, space considerations within the overall device, EMI shielding and heat dissipation needs, and other factors.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed:

1. An assembly comprising:
a board level shield including an opening having a perimeter;
a thermally-conductive electromagnetic interference (EMI) absorber configured for attenuating EMI that propagates within the thermally-conductive EMI absorber; and
a structure positioned relative to the board level shield and the thermally-conductive EMI absorber such that EMI passing through the opening is blocked and redirected by the structure to propagate within the thermally-conductive EMI absorber between the board level shield and the structure;
wherein at least a portion of the thermally-conductive EMI absorber is disposed outside the perimeter of the opening within a gap or space separating or defined between an upper surface of the board level shield and a lower surface of the structure and is configured to be operable for attenuating EMI that propagates within the at least a portion of the thermally-conductive EMI absorber between the upper surface of the board level shield and the lower surface of the structure;
wherein the thermally-conductive EMI absorber is configured to attenuate the EMI that passes through the opening and propagates within the thermally-conductive EMI absorber before the EMI can emerge from the thermally-conductive EMI absorber;
wherein the assembly further comprises a thermal interface material in addition to and different than the thermally-conductive EMI absorber and positioned within the opening of the board level shield; and
wherein at least a portion of the thermally-conductive EMI absorber is between the thermal interface material and the structure.

2. The assembly of claim 1, wherein the at least a portion of the thermally-conductive EMI absorber within the gap or space separating or defined between the upper surface of the board level shield and the lower surface of the structure is in direct contact with the upper surface of the board level shield and the lower surface of the structure without any gaps therebetween that would allow EMI to leak or escape without first passing through the thermally-conductive EMI absorber.

3. The assembly of claim 1, wherein at least a portion of the thermally-conductive EMI absorber is within the opening of the board level shield and configured to be operable to channel EMI energy out of the board level shield through the opening, and wherein the thermally-conductive EMI absorber includes at least a bottom dielectric portion positionable in direct contact with a heat source on a substrate when the board level shield is installed to the substrate with the opening over the heat source.

4. The assembly of claim 1, wherein:
the structure comprises a heat removal/dissipation structure; and
the thermally-conductive EMI absorber defines at least part of a thermally-conductive heat path to the heat removal/dissipation structure.

5. An electronic device comprising a printed circuit board having a heat source thereon and the assembly of claim 1, wherein:
the board level shield is mounted to the printed circuit board with the opening over the heat source;
the thermally-conductive EMI absorber defines at least part of a thermally-conductive heat path from the heat source to the structure; and
the board level shield and the thermally-conductive EMI absorber are operable for providing EMI shielding for the heat source.

6. The electronic device of claim 5, wherein:
the structure is a heat sink or a chassis of the electronic device;
the heat source is a chip on the printed circuit board;
the thermally-conductive EMI absorber includes:
  at least a first dielectric portion against the chip;
  a second portion within the opening in the board level shield; and
  a third portion extending within a gap or space separating or defined between the board level shield and the heat sink or the chassis.

7. An electronic device comprising a printed circuit board having a heat source thereon and the assembly of claim 1, wherein:
the board level shield is mounted to the printed circuit board with the opening over the heat source; and
the thermal interface material and the thermally-conductive EMI absorber cooperate to define at least part of a thermally-conductive heat path from the heat source to the heat removal/dissipation structure; and
the board level shield and the thermally-conductive EMI absorber are operable for providing EMI shielding for the heat source.

8. The electronic device of claim 7, wherein:
the structure is a heat sink or a chassis of the electronic device;
the heat source is a chip on the printed circuit board; and
the thermal interface material includes at least a bottom dielectric portion positioned in direct contact with the chip.

9. A shield comprising:
an upper surface having an opening therein;
one or more sidewalls depending from the upper surface and configured for installation to a substrate generally about one or more components on the substrate;
a thermally-conductive EMI absorber including at least a first portion over the opening and a second portion along the upper surface and disposed outside a perimeter of the opening, the thermally-conductive electromagnetic interference (EMI) absorber configured to be operable for attenuating EMI that passes through the opening and propagates within the thermally-conductive EMI absorber before the EMI can emerge from the thermally-conductive EMI absorber; and
a dielectric portion positionable in direct contact with the one or more components on the substrate when the one or more sidewalls are installed to the substrate generally about the one or more components on the substrate;
wherein the shield further comprises a thermal interface material in addition to and different than the thermally-conductive EMI absorber and positioned within the opening in the upper surface.

10. The shield of claim 9, wherein the first portion of the thermally-conductive EMI absorber is in contact with the thermal interface material, and wherein the thermal interface material includes the dielectric portion that is positioned in direct contact with the one or more components on the substrate when the one or more sidewalls are installed to the substrate generally about the one or more components on the substrate.

11. The shield of claim 9, wherein the thermally-conductive EMI absorber includes a third portion within the opening in the upper surface and configured to be operable to channel EMI energy out of the shield through the opening, and wherein the thermally-conductive EMI absorber includes the dielectric portion that is positioned in direct contact with the one or more components on the substrate when the one or more sidewalls are installed to the substrate generally about the one or more components on the substrate.

12. An assembly including the shield of claim 9 and a structure positioned relative to the shield and the thermally-conductive EMI absorber such that EMI passing through the opening is blocked and redirected by the structure to propagate within the second portion of thermally-conductive EMI absorber, wherein the second portion of the thermally-conductive EMI absorber is within a gap or space separating or defined between the upper surface of the shield and a lower surface of the structure and configured to be operable for attenuating EMI that propagates within the second portion of the thermally-conductive EMI absorber between the upper surface of the shield and the lower surface of the structure.

13. An electronic device comprising a printed circuit board having a heat source thereon and the assembly of claim 12, wherein:
the shield is mounted to the printed circuit board with the opening over the heat source;
the structure is a heat sink or a chassis of the electronic device;
the thermally-conductive EMI absorber defines a thermally-conductive heat path from the heat source to the heat sink or the chassis; and
the shield and the thermally-conductive EMI absorber are operable for providing EMI shielding for the heat source.

14. A method comprising:
positioning a thermally-conductive EMI absorber relative to an opening in an upper surface of a shield such that at least a portion of the thermally-conductive EMI absorber is disposed outside a perimeter of the opening; and
positioning the shield having the opening and the thermally-conductive EMI absorber over a heat source on a substrate, such that the thermally-conductive EMI absorber is operable for attenuating EMI that passes through the opening and propagates within the thermally-conductive EMI absorber before the EMI can emerge from the thermally-conductive EMI absorber and such that a dielectric portion is in contact with or adjacent the heat source to help prevent shorting out of the heat source;
wherein the method includes positioning a thermal interface material including the dielectric portion relative to the thermally-conductive EMI absorber, the heat source, and the shielding, such that:
  the thermal interface material is within the opening in the upper surface of the shield,
  at least a portion of the thermally-conductive EMI absorber is between the thermal interface material and the structure, and
  the dielectric portion of the thermal interface material contacts or is adjacent the heat source.

15. The method of claim 14, further comprising positioning a structure relative to the shield and the thermally-conductive EMI absorber such that at least a portion of the thermally-conductive EMI absorber is within a gap or space separating or defined between the upper surface of the shield and a lower surface of the structure and such that EMI passing through the opening is blocked and redirected by the structure to propagate within and be attenuated by the at least a portion thermally-conductive EMI absorber within the gap or space separating or defined between the upper surface of the shield and the lower surface of the structure.

16. The method of claim 15, wherein:

the thermally-conductive EMI absorber defines at least part of a thermally-conductive heat path from the heat source to the structure;

the thermally-conductive EMI absorber is configured to attenuate the EMI that passes through the opening and propagates within the thermally-conductive EMI absorber before the EMI can emerge from the thermally-conductive EMI absorber; and the shield and the thermally-conductive EMI absorber are operable for providing EMI shielding for the heat source.

17. The assembly of claim 1, wherein:

the board level shield includes a top surface having the opening therein, and one or more sidewalls depending from the top surface and configured for installation to a printed circuit board generally about one or more components on the printed circuit board;

the structure comprises a heat sink or a chassis of an electronic device;

the thermally-conductive EMI absorber comprises a polymer matrix loaded with thermally-conductive particles and EMI absorbing particles; and the thermally-conductive EMI absorber has a thermal conductivity of at least 2 W/mK.

18. The assembly of claim 17, wherein:

the thermally-conductive particles comprise at least one of alumina, zinc oxide, boron nitride, silicon nitride, aluminum, aluminum nitride, iron, metallic oxides, graphite, and a ceramic;

the EMI absorbing particles comprise at least one of carbonyl iron, iron silicide, iron oxide, iron alloy, iron-chrome compound, magnetic metal powder, permalloy, ferrite, magnetic alloy, magnetic powder, magnetic flakes, magnetic particles, nickel-based alloy, nickel-based powder, and chrome alloy; and the thermally-conductive EMI absorber has an EMI attenuation of at least 17 dB/cm at a frequency of at least 15 GHz.

* * * * *